United States Patent
Koukitu et al.

(10) Patent No.: US 8,129,208 B2
(45) Date of Patent: Mar. 6, 2012

(54) N-TYPE CONDUCTIVE ALUMINUM NITRIDE SEMICONDUCTOR CRYSTAL AND MANUFACTURING METHOD THEREOF

(75) Inventors: Akinori Koukitu, Fuchu (JP); Yoshinao Kumagai, Fuchu (JP); Toru Nagashima, Shunan (JP); Kazuya Takada, Shunan (JP); Hiroyuki Yanagi, Shunan (JP)

(73) Assignees: Tokuyama Corporation, Shunan-shi (JP); Tokyo University of Agriculture and Technology, Tokyo (JP)

( * ) Notice: Subject to any disclaimer, the term of this patent is extended or adjusted under 35 U.S.C. 154(b) by 356 days.

(21) Appl. No.: 12/526,196

(22) PCT Filed: Feb. 2, 2008

(86) PCT No.: PCT/JP2008/052207
§ 371 (c)(1),
(2), (4) Date: Aug. 6, 2009

(87) PCT Pub. No.: WO2008/096884
PCT Pub. Date: Aug. 14, 2008

(65) Prior Publication Data
US 2010/0320462 A1 Dec. 23, 2010

(30) Foreign Application Priority Data
Feb. 7, 2007 (JP) ................................ 2007-027732

(51) Int. Cl.
*H01L 21/02* (2006.01)
(52) U.S. Cl. .................. 438/46; 438/479; 257/E21.108; 257/E21.131; 257/E29.104; 257/E29.168; 257/E33.023
(58) Field of Classification Search .............. 438/46–52, 438/89–93, 479–486; 257/E21.108, 131, 257/29.104, 168, 33.023, 33.025
See application file for complete search history.

(56) References Cited

U.S. PATENT DOCUMENTS 6,204,489 B1 * 3/2001 Katsuda et al. ............... 219/544
(Continued)

FOREIGN PATENT DOCUMENTS
JP      2000-91234 A     3/2000
(Continued)

OTHER PUBLICATIONS

Taniyasu et al., "Electrical Conduction Properties of n-type Si-Doped AlN with High Electron Mobility (>100 cm$^2$ V$^-$s$^-$)," Applied Physics Letters, vol. 85, No. 20, Nov. 15, 2004, pp. 4672-4674.
(Continued)

*Primary Examiner* — Michael Lebentritt
(74) *Attorney, Agent, or Firm* — Birch, Stewart, Kolasch & Birch, LLP

(57) ABSTRACT

This invention provides a self supporting substrate which consists of a n-type conductive aluminum nitride semiconductor crystal and is useful for manufacturing the vertical conductive type AlN semiconductor device. The n-type conductive aluminum nitride semiconductor crystal, by which the self supporting substrate is made up, contains Si atom at a concentration of $1\times10^{18}$ to $5\times10^{20}$ cm$^{-3}$ is substantially free of halogen atoms and substantially does not absorb the light having the energy of not more than 5.9 eV. The self supporting substrate can be obtained by a method comprising the steps of forming an AlN crystal layer on a single crystal substrate such as a sapphire by the HVPE method, preheating the obtained substrate having the AlN crystal layer to a temperature of 1,200° C. or more, forming a second layer consisting of the n-type conductive aluminum nitride semiconductor crystal is formed on the AlN crystal layer in high rate by the HVPE method and separating the second layer from the obtained laminate.

5 Claims, 1 Drawing Sheet

U.S. PATENT DOCUMENTS

| | | | |
|---|---|---|---|
| 6,364,965 B1 * | 4/2002 | Masuda et al. | 148/223 |
| 6,524,401 B2 * | 2/2003 | Watanabe et al. | 148/238 |
| 6,852,161 B2 * | 2/2005 | Urashima et al. | 117/104 |
| 7,622,200 B2 * | 11/2009 | Ohsawa et al. | 428/690 |
| 7,704,411 B2 * | 4/2010 | Daicho et al. | 252/301.4 R |
| 2005/0166835 A1 | 8/2005 | Koukitsu et al. | |
| 2006/0220032 A1 | 10/2006 | Arai et al. | |
| 2008/0230780 A1 * | 9/2008 | Urashima | 257/51 |
| 2010/0093124 A1 * | 4/2010 | Koukitu et al. | 438/46 |
| 2010/0279020 A1 * | 11/2010 | Melnik et al. | 427/419.7 |
| 2011/0012109 A1 * | 1/2011 | Kryliouk et al. | 257/49 |
| 2011/0094438 A1 * | 4/2011 | Koukitu et al. | 117/3 |

FOREIGN PATENT DOCUMENTS

| | | |
|---|---|---|
| JP | 2003-273398 A | 9/2003 |
| JP | 2003-303774 A | 10/2003 |
| JP | 2006-240895 A | 9/2006 |
| JP | 2006-261219 A | 9/2006 |
| JP | 2006-335607 A | 12/2006 |

OTHER PUBLICATIONS

Khan et al., "III-Nitride UV Devices", Japanese Journal of Applied Physics, vol. 44, No. 10, 2005, pp. 7191-7206.

Kovalenkov et al., "Thick AlN Layers Grown by HVPE", Journal of Crystal Growth, vol. 281, 2005, pp. 87-92.

International Preliminary Report on Patentability and Written Opinion of the International Searching Authority in corresponding International Application PCT/JP2008/052207, issued Aug. 20, 2009.

* cited by examiner

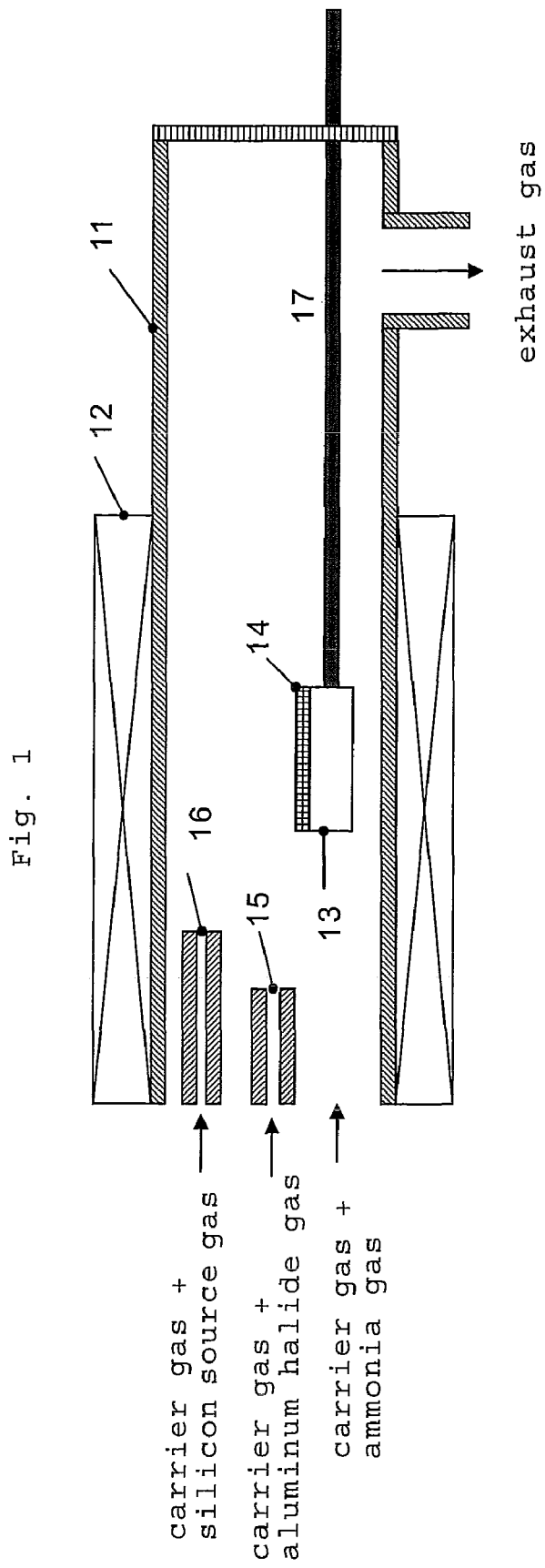

N-TYPE CONDUCTIVE ALUMINUM NITRIDE SEMICONDUCTOR CRYSTAL AND MANUFACTURING METHOD THEREOF

This application is the U.S. National Phase of PCT/JP2008/052207, filed Feb. 5, 2008, for which priority is claimed under 35 U.S.C. §120. This application also claims priority under 35 U.S.C. §119(a) to Japanese Patent Application no. 2007-027732, filed in Japan on Feb. 7, 2007.

FIELD OF THE INVENTION

The present invention relates to an n-type conductive aluminum nitride semiconductor crystal doped with Si atom and manufacturing method thereof.

BACKGROUND OF THE INVENTION

Aluminum nitride (AlN) is expected to be a material for ultraviolet light emitting device since it has as great as 6.2 eV of the forbidden band gap and it is a directly transmitting-type semiconductor.

In order to form a semiconductor device including a light emitting device, it is necessary to form a n-type semiconductor layer jointed electrically to a n-electrode, a p-type semiconductor layer jointed electrically to a p-electrode and a laminated structure therebetween, where in the laminated structure comprises a clad layer, an active layer and the like. For the semiconductor device, it is required in view of light emitting efficiency that each of those layers consist of a crystal having high crystallinity, that is, having low density of point defect or dislocation and that the difference of the lattice constant and the difference of thermal expansion coefficient between the crystal and aluminum gallium nitride (AlGaN) which forms the laminated structure are small, and it is also required in view of preventing degradation of the device that the crystal has high heat conductivity. Therefore, it is advantageous for making an AlN semiconductor device to form the above layered structure on an AlN single crystal substrate.

The AlN single crystal substrate is usually produced by the vapor-phase growing method in which the AlN single crystal is grown on a single crystal substrate such as sapphire since it is difficult to make the homoepitaxial substrate. Among the vapor-phase growing methods, the hydride vapor phase epitaxy (HVPE) is known as the method which has the high deposition rate. The HVPE method is not suited for forming the crystal layer of the semiconductor light emitting device because it is relatively difficult to precisely control the film thickness compared to the molecular beam epitaxy (MBE) method and the metal organic vapor phase epitaxy (MOVPE) method, though it is possible to obtain the single crystal of good crystallinity at a high deposition rate. Therefor, it is also possible to manufacture the substrate consisted of only the AlN single crystal (AlN-selfsupporting substrate) by forming a thick film of the AlN single crystal layer on a substrate such as sapphire using the HVPE method followed by separating it (see JP-A 2005-252248).

When manufacturing the AlN semiconductor device, forming of the n-type conductive aluminum nitride semiconductor crystal layer on a substrate is required first, and as a method of forming the n-type conductive aluminum nitride semiconductor crystal, the approach of forming the n-type conductive AlN crystal layer wherein being doped with Si by the MOVPE method is known (see JP-A 2003-273398). In addition, as for the InGaN, AlGaN, and AlInGaN crystal systems, the method of forming the n-type conductive crystal layer wherein being doped with Si by the HVPE method is known (JP-A 2000-91234).

SUMMARY OF THE INVENTION

When forming the n-type conductive aluminum nitride semiconductor crystal layer on the AlN-selfsupporting substrate, the methods described above in JP-A 2003-273389 and JP-A 2000-91234 could be also applied. In case of producing the AlN semiconductor device by forming the n-type conductive aluminum nitride semiconductor crystal layer by these methods followed by forming the various types of crystal layers thereon, a part of the layer grown on the n-type conductive aluminum nitride semiconductor crystal layer has to be removed by dry etching before forming n-type electrode on the n-type conductive aluminum nitride semiconductor crystal layer because the AlN-selfsupporting substrate is an insulating material. In such n-type electrode structure wherein the electric current flows along the n-type conductive aluminum nitride semiconductor crystal layer and the current pass becomes laterally elongated, the heat resulting in deterioration of the device properties is generated by the increased electric resistance corresponding to the elongation of the current pass.

If a selfsupporting substrate consisted of the n-type conductive aluminum nitride semiconductor crystal can be obtained by use of the HVPE method, it will be possible to form the n-electrode directly on the backside of the substrate leading to solution of the above problems. Applying the above described method disclosed in JP-A 2000-91234 to the AlN, however, it was found that homogeneity of the AlN which grows on the substrate was markedly deteriorated because the reaction between aluminum halide used as an aluminum source and ammonia gas used as a nitrogen source is very fast compared to the reaction between gallium halide and ammonia. It was also found that the AlN single crystal film having enough thickness to obtain the selfsupporting substrate could not be produced efficiently by the method described in JP-A 2000-91234 because the highest crystal growth rate to obtain a single crystal at the temperature of 1,100° C. was around a few μm/h. Further found was that halogen impurities were contained in the obtained crystal layers. When containing halogen impurities, there are concerns about reduction of the durability as well as reduction of the electric properties.

The present inventors made every effort for the purpose of obtaining the n-type conductive aluminum nitride semiconductor crystal which has little content of halogen impurities and has good electric properties by the HVPE method. Consequently, we found that not only the effect of increasing the growing rate was observed, but also the crystal quality, i.e. the dislocation density contained in the crystal was reduced, further, content of halogen impurities was markedly reduced in the case of firstly forming the AlN crystal layer followed by secondly forming the n-type conductive aluminum nitride semiconductor crystal layer thereon instead of forming the n-type conductive aluminum nitride semiconductor crystal directly on the substrate and in the case of making the substrate temperature at 1,200° C. or more when forming the crystal layer. Then we examine physical properties of the n-type conductive aluminum nitride semiconductor crystal obtained in that way to find that the n-type conductive aluminum nitride semiconductor crystal is characterized in that it does not substantially absorb the light which has the energy of not more than 5.9 eV. And this finding has lead to completion of the present invention.

Therefore, means for solving the above tasks provided by the invention are as follows:

(1) a laminate comprising a single crystal substrate (except for the aluminum nitride single crystal substrate), an aluminum nitride crystal layer and a n-type conductive aluminum nitride semiconductor crystal layer, wherein the substrate and the layers are laminated in above mentioned order and the n-type conductive aluminum nitride semiconductor crystal layer consists of a n-type conductive aluminum nitride semiconductor crystal containing Si atom at a concentration of $1\times10^{18}$ to $5\times10^{20}$ cm$^{-3}$, being substantially free from halogen atoms, and substantially not absorbing the light having the energy of not more than 5.9 eV.

(2) a laminate comprising an aluminum nitride single crystal substrate and a n-type conductive aluminum nitride semiconductor crystal layer thereon, wherein the layer consists of a n-type conductive aluminum nitride semiconductor crystal containing Si atom at a concentration of $1\times10^{18}$ to $5\times10^{20}$ cm$^{-3}$, being substantially free from halogen atoms, and substantially not absorbing the light having the energy of not more than 5.9 eV.

(3) a method of manufacturing the said laminate of (1) characterized by comprising steps of:

(A) forming AlN crystal layer having the thickness of not less than 0.5 nm on the single crystal substrate (except for the aluminum nitride single crystal substrate) by vapor-phase growing in which the heated single crystal substrate is contacted with a gas containing an Al halide and a nitrogen-containing compound to form an AlN crystal, and (B) preheating the obtained substrate having the aluminum nitride crystal layer on the surface to 1,200° C. or more, then forming the n-type conductive aluminum nitride semiconductor crystal on the aluminum nitride crystal layer of the substrate by vapor-phase growing in which the preheated substrate is contacted with a gas containing an Al halide, a nitrogen-containing compound and a compound represented by the formula SiH$_x$Cl$_{4-x}$ (wherein, x is an integer of 0 to 3) to form the n-type conductive aluminum nitride semiconductor crystal doped with Si atom.

(4) a method of manufacturing the laminate of the said (2) characterized by comprising a step of preheating the aluminum nitride single crystal substrate to 1,200° C. or more, then forming the n-type conductive semiconductor crystal layer on the aluminum nitride single crystal substrate by vapor-phase growing in which the preheated substrate is contacted with a gas containing an Al halide, a nitrogen-containing compound and a compound represented by the formula SiH$_x$Cl$_{4-x}$ (wherein, x is an integer of 0 to 3) to form the n-type conductive aluminum nitride semiconductor crystal doped with Si atom.

(5) a selfsupporting substrate consisting of the n-type conductive aluminum nitride semiconductor crystal containing Si atom at a concentration of $1\times10^{18}$ to $5\times10^{20}$ cm$^{-3}$, being substantially free from halogen atoms, and substantially not absorbing the light having the energy of not more than 5.9 eV.

(6) a method of manufacturing the selfsupporting substrate of the said (5) characterized by comprising steps of:

(A) forming the aluminum nitride crystal layer having the thickness of not less than 0.5 nm on the single crystal substrate (except for the aluminum nitride single crystal substrate) by vapor-phase growing in which the heated single crystal substrate is contacted with a gas containing an Al halide and a nitrogen-containing compound to form an AlN crystal, (B') preheating the obtained substrate having the aluminum nitride crystal layer on the surface to 1,200° C. or more, then forming the n-type conductive aluminum nitride semiconductor crystal layer having the thickness of not less than 2 µm on the aluminum nitride crystal layer of the substrate by vapor-phase growing in which the preheated substrate is contacted with a gas containing an Al halide, a nitrogen-containing compound and a compound represented by the formula SiH$_x$Cl$_{4-x}$ (wherein, x is an integer of 0 to 3) to form the n-type conductive semiconductor aluminum nitride crystal doped with Si atom, and (C) separating the n-type conductive aluminum nitride semiconductor crystal layer doped with Si atom from the obtained substrate having the n-type conductive aluminum nitride semiconductor crystal layer doped with Si atom on the surface.

(7) a method of manufacturing the selfsupporting substrate of the said (5) characterized by comprising steps of:

(B') preheating the aluminum nitride single crystal substrate to 1,200° C. or more, then forming the n-type conductive aluminum nitride semiconductor crystal layer having the thickness of not less than 2 µm on the aluminum nitride single crystal substrate by vapor-phase growing in which the preheated substrate is contacted with a gas containing an Al halide, a nitrogen-containing compound and a compound represented by the formula SiH$_x$Cl$_{4-x}$ (wherein, x is an integer of 0 to 3) to form the n-type conductive aluminum nitride semiconductor crystal doped with Si atom, and (C) separating the n-type conductive aluminum nitride semiconductor crystal layer doped with Si atom from the obtained substrate having the n-type conductive aluminum nitride semiconductor crystal layer doped with Si atom on the surface.

(8) a semiconductor device comprising a layer consisting of a n-type conductive aluminum nitride semiconductor crystal containing Si atom at a concentration of $1\times10^{18}$ to $5\times10^{20}$ cm$^{-3}$, being substantially free from halogen atoms, and substantially not absorbing the light having the energy of not more than 5.9 eV.

(9) a method of manufacturing the semiconductor device of the said (8) characterized by comprising the step of forming the semiconductor device structure on one surface of the selfsupporting substrate of the said (5).

In addition, in the said methods of (3) and (6), the temperature of the substrate in the said step (A) is preferably set as 1,000 to 1,150° C. from the view point of ensuring that excellent n-type conductive aluminum nitride semiconductor crystal layer can be obtained.

BRIEF DESCRIPTION OF THE DRAWING

FIG. 1 is a schematic drawing of a representative vapor-phase-growing apparatus used in the present invention.

DETAILED DESCRIPTION OF THE INVENTION

The laminate of the invention is a laminate comprising a single crystal substrate (except for the aluminum nitride single crystal substrate), an aluminum nitride crystal layer and a n-type conductive aluminum nitride semiconductor crystal layer, wherein the substrate and the layers are laminated in above mentioned order and the n-type conductive aluminum nitride semiconductor crystal layer consists of a n-type conductive aluminum nitride semiconductor crystal containing Si atom at a concentration of $1\times10^{18}$ to $5\times10^{20}$ cm$^{-3}$, being substantially free from halogen atoms, and substantially not absorbing the light having the energy of not more than 5.9 eV.

As the said single crystal substrate, for example, sapphire, silicon nitride, gallium nitride, zinc oxide, silicon, zirconium boride may be used. Among them, sapphire is preferably used because of good heat stability and good ultraviolet light transmission.

The laminate of the invention has an "aluminum nitride crystal layer" (hereinafter, also referred to as the intermediate layer) between the said single crystal substrate and the layer consisted of the n-type conductive aluminum nitride semiconductor crystal (hereinafter, also referred to as the present n-type conductive aluminum nitride semiconductor crystal) which has the Si atom content of $1\times10^{18}$ to $5\times10^{20}$ cm$^{-3}$, does not substantially contain halogen atoms, and does not substantially absorb the light which has the energy of not more than 5.9 eV (hereinafter, this layer is also referred to as the present n-type conductive aluminum nitride semiconductor crystal layer). The intermediate layer is necessary to obtain the present crystal as the present n-type conductive aluminum nitride semiconductor crystal when it will grow on the layer at high growing rate.

When not forming such the intermediate layer, it would be difficult to form the present n-type conductive aluminum nitride semiconductor crystal layer by the HVPE method.

The crystal which constitutes the intermediate layer is preferably grown in the temperature range of 1,000 to 1,150° C. by the HVPE method. The intermediate layer which has the film thickness corresponding to the thickness of one or more layers of the unit lattice of the aluminum nitride can be grown on the substrate in the said temperature range by controlling the growing time and the growing rate, which can be controlled by feeding quantity of an aluminum halide and the nitrogen source gas as the raw material, to 2 to 50 μm/h. The film thickness of the intermediate layer is preferably in the range of 0.5 to 200 nm, particularly preferably 5 to 150 nm. According to the inventors' identification, the intermediate layer formed in such way has the columnar crystalline form. The crystalline form may be observed using an atomic force microscope. Although causal relationship with the crystalline form is not clear, confirmed was the effect of improving crystallinity of the n-type conductive AlN layer formed on the intermediate layer and the smoothness of the surface by forming the intermediate layer which has the columnar crystalline form or by forming the n-type conductive AlN layer immediately after forming the intermediate layer by means of the same HVPE. When using the present n-type conductive aluminum nitride semiconductor crystal layer of the top layer or silicon substrate as the single crystal substrate, silicon atoms sometimes diffuse from the layer or the substrate, accordingly, the intermediate layer sometimes contain silicon atoms, however, the concentration of silicon atom is usually lower than the one in the present n-type conductive aluminum nitride semiconductor crystal layer.

Further, the laminate of the invention may be the one consisted of the present n-type conductive aluminum nitride semiconductor crystal layer laid on the aluminum nitride single crystal substrate without having the intermediate layer as described above.

The said aluminum nitride single crystal substrate includes the one wherein the substrate itself is consisted of the aluminum nitride crystal, of course, and the one which has the aluminum nitride single crystal layer on the substrate consisted of the material other than aluminum nitride or the one which has aluminum nitride single crystal layer on the aluminum nitride polycrystal substrate. Nevertheless, even when using the aluminum nitride single crystal substrate, it is preferable to form the intermediate layer which grows by the HVPE method in the temperature range of 1,000 to 1,150° C. in view of crystallinity of the n-type conductive AlN layer and the smoothness of the surface.

The present n-type conductive aluminum nitride semiconductor crystal consists of an aluminum nitride crystal containing doped Si atom at a concentration of $1\times10^{18}$ to $5\times10^{20}$ cm$^{-3}$, being substantially free from halogen atones, and substantially not absorbing the light having the energy of not more than 5.9 eV.

The present n-type conductive aluminum nitride semiconductor crystal may be polycrystal or single crystal, however, single crystal is preferred in view of usefulness as the substrate for the semiconductor device because in the case of polycrystal, the crystal grain boundary serves as the compensation site for the carrier electron resulting in inhibition of conductivity. In addition, even in the case of single crystal, if there is dislocation in the single crystal, dislocation serves as the compensation site for the carrier electron resulting in inhibition of conductivity, therefore, the dislocation density of the crystal is preferably not more than $2\times10^{10}$ cm$^{-2}$, particularly preferably not more than $5\times10^{9}$ cm$^{-2}$.

The Si atom content in the present n-type conductive aluminum nitride semiconductor crystal is $1\times10^{18}$ to $5\times10^{20}$ cm$^{-3}$. Containing such amount of Si atom enables to exhibit superior properties as the n-type semiconductor. It is assumed that this is because the amount as described above allows doping with Si atom in the mode where the Si atom occupies the Al site and electrons generated by substitution of the Si atom contribute effectively to conduction as carriers. In view of electric conductivity, the Si atom content is preferably $1\times10^{18}$ to $5\times10^{20}$ cm$^{-3}$, particularly, $5\times10^{18}$ to $1\times10^{20}$ cm$^{-3}$. In addition, the Si atom content can be measured by the secondary ion mass spectrometry (SIMS). In this method, the composition and concentration profile of the elements contained in the object to be measured are determined by the mass spectrometry in which the ion species (secondary ion) sputtered by the cesium ion, as a primary ion, radiated to the object in the high vacuum are quantified.

The present n-type conductive aluminum nitride semiconductor crystal is characterized in that it is substantially free from the halogen atom impurities such as the chlorine atom. Herein, substantially free from halogen atoms means that the halogen atom content is not more than $5\times10^{18}$ cm$^{-3}$. Suppressing halogen atom content improves electric properties as well as enhances the durability. In view of these effects, the halogen atom content is preferably not more than $1\times10^{18}$ cm$^{-3}$. In the present invention, the growing temperature of 1,200° C. or more is realized by heating the substrate locally by using the apparatus as described in JP-A 2005-252248. This is because a high temperature of 1,200° C. or more is needed in order to grow the high quality aluminum nitride single crystal.

On the other hand, in the method described in JP-A 2000-91234 wherein the reaction tube is heated from the outside to heat the substrate to 1,100° C., the growing temperatures are limited to 1,100 to 1,200° C. which are heat resistance temperatures of the silica glass used for a reaction tube which makes it practically difficult to obtain the high quality aluminum nitride single crystal. This is because the reaction between an aluminum halide used as the aluminum raw material and ammonia gas used as the nitrogen source is much faster compared to the reaction between an gallium halide and ammonia. Therefore the AlN crystal grows on the substrate without sufficient diffusion of aluminum chemical species adsorbed on the substrate surface resulting in containing the dislocation density in order of $10^{10}$ cm$^{-2}$ and contamination of halogen impurities. Further, due to the fast reaction of raw material gas, the homogeneity of the growing AlN is markedly deteriorated. Furthermore, in case of AlN, the crystal growing rate to obtain the single crystal is around a few μm/h at most which is insufficient for manufacturing the selfsupporting substrate.

It is assumed that growing the aluminum nitride semiconductor crystals at the temperature of 1,200° C. or more promotes diffusion of aluminum chemical species adsorbed on the substrate surface leading to improvement of the crystal quality and also make the reaction between the aluminum halide gas and the nitrogen source gas on the substrate surface proceed sufficiently leading to substantially not containing halogen atoms remaining in the semiconductor crystals. In addition, the content of halogen atom impurities can be measured by the secondary ion mass spectrometry similarly for the Si concentration.

Further, the present n-type conductive aluminum nitride semiconductor crystal has a superior characteristic that it does not substantially absorb the light which has the energy of not more than 5.9 eV, the characteristic being not obtained when doping with Si in the InGaN, AlGaN, and AlInGaN crystals. Accordingly, in an AlN semiconductor device produced by forming different crystal layers on the selfsupporting substrate consisting of the present n-type conductive aluminum nitride semiconductor crystal, the light intensity of the device can be increased by setting up the reflecting means which reflects the light from the bottom surface of the device since the selfsupporting substrate does not absorb the light.

Herein, not absorbing the light which has the energy of not more than 5.9 eV means that the absorption coefficient for the light which has the energy of not less than 1.59 eV and not more than 5.9 eV is not more than 5,000 cm$^{-1}$, preferably not more than 2,000 cm$^{-1}$, wherein the absorption coefficient is obtained as follows: absorption spectra of the visual and ultraviolet regions, the energy range of which is 1.59 to 5.9 eV are measured for the n-type conductive aluminum nitride semiconductor crystal grown on the substrate or the n-type conductive aluminum nitride semiconductor crystal selfsupporting substrate by the transmission method and the measurements are used to calculate the absorption coefficient according to the formula: $I/I_0 = EXP(-\alpha L)$ (provided that the background is eliminated by the background measurement), wherein, $I_0$, I, L, and a represent the intensity of incident light, intensity of transmission light, thickness of the n-type conductive aluminum nitride semiconductor crystal or selfsupporting substrate thereof, and absorption spectra, respectively. When measuring, it is preferable to eliminate the influence of reflection of the surface of the object to be measured by performing the background measurement. Further, when the diffuse reflection occurs on the surface of the AlN, it is possible to reduce the influence of the diffuse reflection by polishing in advance, or when polishing is difficult, by setting the object to be measured in the solvent which has the similar refraction index.

Further, the resistivity of the present n-type conductive aluminum nitride semiconductor crystal measured by the noncontact resistivity measurement method is preferably not more than 2,000 Ω·cm, particularly not more than 100 Ω·cm. In noncontact resistivity measurement method, the resistivity is measured based on the modulation of the high-frequency voltage returning to a probe, the high-frequency voltage is modulated by the induced current which is generated on the surface of a conductive object to be measured by applying the high-frequency voltage to the conductive object through the probe. Of course, the resistivity may be measured also by forming the electrode in the n-type conductive aluminum nitride semiconductor crystal followed by performing the current-voltage measurement (I-V measurement).

It is desirable that the thickness of the n-type conductive aluminum nitride semiconductor crystal layer is preferably not less than 2 μm, particularly preferably not less than 3 μm when the laminate of this invention itself is used as a substrate for the light emitting device having the structure of the transverse conducting type (also referred to as the flip chip type). But in view of manufacturing the selfsupporting substrate, it is preferable to further grow it to be the film which has more thickness of, for example, not less than 20 μm, particularly not less than 50 μm.

The laminate of this invention can be suitably manufactured according to the method (hereinafter, referred to the first method of the invention) which comprises the steps of (A) forming the aluminum nitride crystal layer (intermediate layer) which has the thickness of not less than 0.5 nm on a heated single crystal substrate (except for the aluminum nitride single crystal substrate) by vapor-phase growing in which the heated single crystal substrate is contacted with a gas containing an Al halide and a nitrogen-containing compound to form an AlN crystal, and (B) preheating the obtained substrate having the AlN crystal layer on the surface to 1,200° C. or more, then forming the n-type conductive semiconductor crystal layer on the aluminum nitride crystal layer of the substrate by vapor-phase growing in which the preheated substrate is contacted with a gas containing an Al halide, a nitrogen-containing compound and a compound represented by the formula $SiH_xCl_{4-x}$ (wherein, x is an integer of 0 to 3) to form the n-type conductive aluminum nitride semiconductor crystal doped with Si atom.

The said both steps (A) and (B) can be performed according to the HVPE method serially using the conventional HVPE apparatus without putting the sample out of the apparatus. As the HVPE apparatus, those which can heat the substrate to 900 to 1,700° C. as shown in FIG. 1 in the said JP-A 2005-252248 can be suitably used. When the said steps (A) and (B) are performed serially in the same apparatus, the present n-type conductive aluminum nitride semiconductor crystal layer which has the low dislocation density, good crystallinity and superior smoothness of the surface can be formed, probably because growing of the step (B) occurs while the activity of the surface on the intermediate layer formed in the step (A) is maintained. From these reasons, the said steps (A) and (B) are preferably performed serially in the same apparatus.

The laminate of the invention can be manufactured also by the alternative method described below. (B') the method (hereinafter, referred to the second method of the invention) characterized by comprising the step of preheating the aluminum nitride single crystal substrate to 1,200° C. or more, then forming the n-type conductive aluminum nitride semiconductor crystal layer on the aluminum nitride single crystal substrate by vapor-phase growing in which the preheated substrate is contacted with a gas containing an Al halide, a nitrogen-containing compound and a compound represented by the formula $SiH_xCl_{4-x}$ (wherein, x is an integer of 0 to 3) to form the n-type conductive aluminum nitride semiconductor crystal doped with Si atom.

In the second method of the invention, step (A) of the first method of the invention is not performed and the above described step (B') is performed using the aluminum nitride single crystal substrate as the substrate.

Examples of manufacturing the laminate according to the first method of the invention using the apparatus shown in the FIG. 1 will be described below.

The apparatus shown in the FIG. 1 is provided with a reactor body consisted of cylindrical quartz glass reaction tube 11, external heating means 12 placed outside the reaction tube 11 and a susceptor 13 placed inside the reaction tube 11.

Its structure is such that the carrier gas and material gas are supplied from an end of the reaction tube 11 and the carrier gas and unreacted reaction gas are exhausted from the opening set at the side wall near the other end. Additionally, the above described external heating means 12 is used for the purpose of mainly maintaining the temperature of the reacting gases in the reaction region at a predetermined temperature, rather than heating the substrate 14, therefore it is not necessarily required. As the external heating means 12, for example, a resistance heating heater, a high frequency heating apparatus, a high frequency induction heating apparatus and a lamp heater may be used. In addition, the above described susceptor 13 allows the substrate 14 to be held on the top surface.

In the reaction tube on the raw material gas supplying side in the apparatus shown in FIG. 1, an aluminum halide gas diluted with the carrier gas is supplied from the nozzle 15 and the silicon source gas containing the compound shown as $SiH_xCl_{4-x}$ (wherein, x is an integer of 0 to 3) diluted with the carrier gas is supplied from the nozzle 16. Also, the nitrogen source gas diluted with the carrier gas is supplied using the space between the nozzle 15 and 16 as the flow pass.

The above described flow pass of the aluminum halide gas is connected with the "aluminum halide gas supplying source" not shown in FIGURE through the piping. The aluminum halide gas may be obtained by reacting an aluminum metal with hydrogen halide. For example, as described in JP-A 2003-303774, the reactor performing such reaction may be made as the "aluminum halide gas supplying source". The aluminum halide gas may be also obtained by heating and vaporizing the aluminum halide solid itself. In this case, as aluminum halides, those which are anhydrous crystals and have few impurities are preferably used. Since contamination with impurities in the material gas results in not only generation of defects in crystals formed, but also deterioration of electric properties, substances for the gas material are required to be of high purity.

For the silicon source gas, it is connected with the silicon source gas supplying source not shown in FIGURE through the piping. The gas which contains a compound represented by the formula $SiH_xCl_{4-x}$ (wherein, x is an integer of 0 to 3) may be used as the silicon source gas in the present invention. When using $SiCl_4$ as the silicon source gas, $SiCl_4$ is stored in a metal container called bubbler since $SiCl_4$ is a liquid at room temperature, the temperature in the container is maintained to a predetermined temperature from outside, and the carrier gas is flowed with bubbling through the liquid in the metal container in the state where the interior temperature of $SiCl_4$ is controlled, thereby the $SiCl_4$ gas corresponding to the product of the saturated vapor pressure at the maintained temperature and volume flowed through is transported with the carrier gas. On the other hand, $SiH_xCl_{4-x}$ (wherein, x is an integer of 1 to 3) is transported by a mass flow controller with controlled flow since it is a gas in a room temperature. When using $SiH_xCl_{4-x}$ (wherein, x is an integer of 1 to 3), if the concentration of the gas supplied is high, those diluted with an inert gas such as nitrogen, argon and helium or hydrogen gas as the base gas may be charged in a bomb in advance and the quantity supplied may be controlled by a flow controller.

On the other hand, for the flow pass of the nitrogen source gas, it is connected to the "nitrogen source gas supplying source" not shown in FIGURE by the piping through flow controlling means as well as in the piping downstream the flow controlling means, the piping to the carrier gas supplying source is connected through the flow control ling means such that the nitrogen source gas can be diluted to a desired dilution factor with the carrier gas. As the nitrogen source gas, a reacting gas containing the nitrogen is adopted while ammonia gas is preferable in view of the cost and handleability. For any raw material gas, those of high purity should be used for similar reasons.

As the carrier gas, for example, the element gas of hydrogen, nitrogen, helium or argon or a mixed gas thereof can be used and impure gases including oxygen, water vapor, carbon monoxide or carbon dioxide are preferably removed in advance using a purifier.

In the apparatus shown in FIG. 1, a complex heater wherein a carbon heat generator is coated with the pyrolytic boron nitride is used as the susceptor 13 to heat the substrate 14 set on the susceptor 13. The end side of the heater has an electrode part, and power is applied from outside to the susceptor through the electrode. The present susceptor can be used stably from a room temperature to a temperature of not more than 1,700° C. that is the temperature range used in the invention because the pyrolytic boron nitride which is coating of the heat generator has the good corrosion resistance against the hydrogen gas, aluminum halide gas, ammonia gas and silicon source gas. While the present susceptor is used in the invention, heating means are not necessarily limited to it if the heating means can heat the substrate locally to not less than 1,200° C. such as described in JP-A 2005-252248.

In the method of the invention, growing of the aluminum nitride semiconductor crystal is performed maintaining the temperature of the substrate 14 higher than that of the wall of the reaction vessel in the reaction region of the raw material gases using the apparatus shown in FIG. 1. Growing the crystal can be suitably performed according to the following procedure:

After setting the substrate on the susceptor in the reaction vessel, the carrier gas is passed through the reaction vessel to change the atmosphere in the vessel into the carrier gas atmosphere. Then in order to remove organic substances on the surface of the substrate, the substrate is maintained in the state of high temperature of 1,000 to 1,100° C. for about 10 minutes by heating the susceptor supplying the electric power to the susceptor or by use of an external heating means (hereinafter, this process is referred to the thermal cleaning). After completion of the thermal cleaning, the procedure is performed wherein the temperature of the substrate is adjusted to 1,000 to 1,150° C. which is the temperature for growing the first layer, that is, the intermediate layer followed by induction of the aluminum halide which is the raw material gas and nitrogen source gas into the reaction vessel to start the reaction, thereby the aluminum nitride crystal of the intermediate layer can be grown on the substrate.

Once the reaction is performed for a predetermined time to obtain the intermediate layer which has the desired thickness, supplying of the aluminum halide gas is stopped to discontinue the growing, then the temperature is adjusted to the one of not less than 1,200° C., which is the temperature for growing the second layer, that is, the n-type conductive aluminum nitride semiconductor crystal, preferably to 1,200 to 1,700° C. followed by restarting the supply of the aluminum halide gas and leading to the second stage of growing of the n-type conductive aluminum nitride semiconductor crystal. In that time, simultaneous supplying of the silicon source gas enables silicon doping to grow the n-type conductive aluminum nitride semiconductor crystal. Growing of the second stage at the high temperature region as described above promotes diffusion of the material gas adsorbed on the growing surface, and it is assumed that the intermediate layer grown at the first stage serves as a good seed crystal (also referred to as a growing nucleus) when growing to the second stage, which realizes the effects such as reduction of the dislocation and improvement of the smoothness of the surface, with result of enabling to grow the high quality of n-type conductive aluminum nitride single crystal. Upon completion of growing of the second stage, supplying of the aluminum halide gas is stopped to end the growing and then the substrate may be removed after cooling. The intermediate layer is grown with the thickness of the film of not less than 0.5 nm, preferably the range of 0.5 to 200 nm, more preferably the range of 5 to 150 nm. In addition, when using the gallium nitride substrate or aluminum nitride substrate as the substrate, ammonia gas may be supplied to the reaction vessel to maintain the partial pressure of the ammonia gas in the atmosphere at not less than 0.0001 atm during heating up in the said thermal cleaning and the heating up process in order to prevent from the thermal decomposition of the substrate material.

If growing of the n-type conductive aluminum nitride semiconductor crystal is performed directly on the base other than the aluminum nitride single crystal substrate without growing the intermediate layer, the substrate surface becomes rough due to exposure to the high temperature before growing of the n-type conductive aluminum nitride semiconductor crystal, which causes generation of the domain in the growing layer and lack of the smoothness of the surface as well as poor performance of doping of the silicon source resulting in marked reduction of the conductivity.

Conditions including the partial pressure of different reaction gases and the carrier gas and the flow rate during the reaction may be set properly according to the dimension and shape of the reaction vessel. Generally, the quantity of the aluminum halide gas supplied is determined considering the growing rate of the aluminum nitride semiconductor crystal on the substrate. When the partial pressure of the aluminum halide gas is defined as the rate of the volume of the aluminum halide gas in the standard state to the total volume of all gases (carrier gas, aluminum halide gas, nitrogen source gas, silicon source gas) in the standard state supplied on the substrate, the range of $1 \times 10^{-6}$ to $1 \times 10^{-1}$ atm is usually selected. It has been confirmed that the silicon concentration uptaken in the n-type conductive aluminum nitride semiconductor crystal is approximately proportional to the quantity of silicon source supplied, therefore it can be controlled by the quantity of silicon source supplied. Generally, the quantity supplied of 0.000001 to 0.1 times, particularly 0.00005 to 0.005 times that of the aluminum halide gas is suitably selected, although not limited to it because it is influenced by the shape of the reactor, the rate and pressure of the gas flow. For the quantity of nitrogen source gas supplied, generally 1 to 100 times, particularly 1 to 20 times that of the aluminum halide gas is suitably selected although not limited to it. The pressure in the system may be any of the reduced, normal or compressed pressure.

It should be understood that the second method of the invention can be carried out in conditions similar to those of the step (B) of the above first method.

Assessment of the grown n-type conductive aluminum nitride semiconductor crystal in the present invention was carried out as follows: For the resistivity, noncontact resistivity measuring apparatus (made by Lehighton Electronics Inc. LEI-1510B) was used. The film thickness was calculated from the area of the substrate, the weight difference of the substrate between before and after growing and the density of the aluminum nitride. The dislocation density was calculated by conducting the plane observation from over the sample with accelerating voltage of 200 kV using a field emission transmission electron type microscopy (made by Phillips Electron Optics Inc. Tecnai F20) followed by measuring of the observed dislocation which was divided by the observed field. Observation of the surface shape was carried out by use of an atomic force microscope. For the impurity concentration, the amounts of silicon and oxygen were quantified by use of the secondary ion mass spectrometry using cesium ions as the primary ions. Transmission/absorption spectra in the visible/ultraviolet regions were measured using V-7300 made by Nipponbunnko Inc.

While the laminate itself of the invention obtained from the first and second methods of the invention can be used as a substrate for the semiconductor device, it is also possible to make an selfsupporting substrate consisted of the present n-type conductive aluminum nitride semiconductor crystal by separating the present n-type conductive aluminum nitride semiconductor crystal layer from the laminate.

As a method for separating the present n-type conductive aluminum nitride semiconductor crystal layer from the laminate of the invention, one of followings is suitably adopted for example: a method of delaminating by laser after forming the thick film; the method of removing the base substrate for growing by reacting ion etching; the method of inserting a thermal decomposition substance such as ZnO or GaN layer into the interface followed by delaminating from the substrate layer during growth.

Since the selfsupporting substrate obtained in such ways has the n-type conductivity itself, the semiconductor layer can be laminated on the selfsupporting substrate to make a semiconductor device. When manufacturing the semiconductor light emitting device using the selfsupported substrate of the invention, the n-type clad layer, active layer, p-type clad layer and p-type electrode may be laminated sequentially on the selfsupported substrate. Forming of these layers are not particularly different from conventional methods and it can be carried out by a method such as, for example, the one described in Japanese Journal of Applied Physics, Vol. 44, No. 10, 2005, pp. 7191-7206.

When manufacturing the semiconductor light emitting device using the selfsupporting substrate of the invention, the n-electrode may be directly formed on the back side of the selfsupporting substrate itself to make a vertical conducting type device. Further, the selfsupporting substrate of the invention transmits the light which has the energy of not more than 5.9 eV, therefore, it is possible to derive the light from the back surface. In this case, then-electrode is preferably a transparent electrode. It is also possible to derive the light emission from the part of device to the surface efficiently by utilizing the n-type electrode itself as a reflecting film.

As described above, according to the method of the invention, a layer consisted of the n-type conductive aluminum nitride semiconductor crystal which has extremely little content of halogen impurities, high electric properties and durability can be grown fast on the substrate. Consequently, a selfsupporting substrate can be also obtained by separating only the layer consisted of the present n-type conductive aluminum nitride semiconductor crystal from the substrate where the layer consisted of the n-type conductive aluminum nitride semiconductor crystal has been formed according to the methods as described above. When manufacturing the semiconductor device using the selfsupporting substrate, n-electrode can be formed directly on the back surface of the selfsupporting substrate to make the so-called vertical conducting type device wherein the n-electrode and p-electrode are formed oppositely. In such a vertical conducting type device, the current pass does not transit the n-type conductive aluminum nitride semiconductor crystal layer in the n-type electrode structure, therefore the electric resistance can be lowered resulting in no deterioration of device properties caused by heat generation and the like. Further, in the said vertical conducting type device, it is possible to derive the light from the back surface since the n-type conductive aluminum nitride semiconductor crystal constituting the above selfsupporting substrate is transparent to the light which has the energy of not more than 5.9 eV, as well as possible to derive the light generated from the device to the surface side efficiently by using the n-type electrode itself as a reflecting film. Furthermore, the vertical conducting type enables to reduce the cost of manufacturing the light emission device since the dry etching essential in the case of the transverse conducting type is not required.

EXAMPLES

The present invention will be described in more detail by following examples, but not intended to limit the invention.

Example 1

In this example, the n-type conductive aluminum nitride semiconductor crystal was grown using the reaction tube shown in the FIG. 1. In the example, the aluminum trichloride gas was generated by reacting the metal aluminum set upstream the reaction tube with hydrogen chloride gas at 500° C. Also, the sapphire (0001) substrate set on the susceptor could be heated to 1,200° C. or more by supplying the electric power from the outside to the carbon heating element using a resistance heating furnace as the external heating apparatus as well as using a susceptor consisted of the pyrolytic boron nitride which has a carbon heating element inside the reaction tube. Further, the aluminum trichloride gas used as the aluminum source gas and ammonia gas used as the nitrogen source gas were reacted to grow aluminum nitride. As the silicon source, $SiCl_4$ was used.

First, a sapphire (0001) substrate was set on the susceptor in the reaction tube, in the normal pressure, 300 sccm of hydrogen gas from the nozzle 15, 600 sccm of nitrogen gas from the nozzle 16, 1,700 sccm of hydrogen gas from the space between the nozzle 15 and nozzle 16, 2,600 sccm in total flow was flowed as the carrier gas. Then the reaction tube was heated to 500° C. from the outside using the external heating apparatus followed by applying the electric power to the susceptor to heat it to 1,065° C. The temperature reached 1,065° C. was maintained for 10 minutes and the substrate was carried out to the thermal cleaning. Then supplied were the aluminum trichloride gas such that its partial pressure supplied was $5\times10^{-4}$ atm to the total flow, and the ammonia gas such that its partial pressure supplied was 2.5 times that of the aluminum trichloride gas and the state was maintained for 5 seconds to grow the aluminum nitride crystal that is the intermediate layer. In addition, for the intermediate layer grown in this example, an experiment was carried out separately wherein only the intermediate layer was grown to confirm that thickness of the film was 22 nm by means of the section SEM. Also, as a result of observation using an atomic force microscope, it was confirmed that the crystal is columnar.

After growing the intermediate layer, supplying was stopped only for aluminum trichloride gas and the susceptor was heated to 1,300° C. in 7 minutes with supplying the ammonia gas. The quantity of ammonia supplied was set as the same as that during growing the intermediate layer. After reaching 1,300° C., supplying of aluminum trichloride gas was restarted, and further the $SiCl_4$ gas was supplied. Supplied were aluminum trichloride gas such that its partial pressure supplied was $5\times10^{-4}$ atm to the total flow, ammonia gas such that its partial pressure supplied was 2.5 times that of the aluminum trichloride gas, and $SiCl_4$ gas such that its partial pressure supplied was 0.0005 times that of the aluminum trichloride gas and the state was maintained for 30 minutes to grow the n-type conducting aluminum nitride semiconductor crystal.

After growing for 30 minutes, supplying of aluminum trichloride gas and the $SiCl_4$ gas was stopped, temperature was lowered by reducing the electric power applied to the susceptor, then temperature of the external heating apparatus was lowered. In that time, the ammonia gas was flowed through the reaction tube until the temperature of the heating apparatus was lowered to 500° C. in order to prevent decomposition of the n-type conducting aluminum nitride semiconductor crystal grown on the substrate. After confirming that the temperature of the heating apparatus was lowered to a room temperature, the substrate was removed from the reaction vessel.

The film thickness of the grown n-type conducting aluminum nitride semiconductor crystal was 3.9 μm and the growing rate was 7.8 μm/h. Silicon concentration measured by the secondary ion mass spectrometer was $1\times10^{19}$ $cm^{-3}$, the oxygen concentration was $1\times10^{19}$ $cm^{-3}$, and the chlorine concentration was not more than $1\times10^{18}$ $cm^{-3}$. The dislocation density was calculated according to the transmission electron microscope and it was $3.4\times10^{9}$ $cm^{-2}$. The resistivity measured by the noncontact resistivity measuring apparatus was 63 Ω·cm. When observing the surface by the atomic force microscope, it was smoothed to the extent that the atomic step was seen. From the absorption spectra in the visible and ultraviolet regions, the absorption coefficient at 1.59 to 5.9 eV was 1,700 $cm^{-1}$, therefore, it was found to substantially transmit at the energy of not more than 5.9 eV.

Example 2

In this example, all procedures and conditions were the same in growing the n-type conducting aluminum nitride semiconductor crystal except that the quantity of $SiCl_4$ supplied during growing the second stage i.e. growing the n-type conducting aluminum nitride semiconductor crystal was 0.005 times the partial pressure of aluminum trichloride gas supplied.

The film thickness of the grown n-type conducting aluminum nitride semiconductor crystal was 5.7 μm and the growing rate was 11.4 μm/h. The silicon concentration measured by the secondary ion mass spectrometer was $1\times10^{20}$ $cm^{-3}$, the oxygen concentration was $1\times10^{19}$ $cm^{-3}$, and the chlorine concentration was not more than $1\times10^{18}$ $cm^{-3}$. The dislocation density was calculated according to the transmission electron microscope and it was $1\times10^{10}$ $cm^{-2}$. The resistivity measured by the noncontact resistivity measuring apparatus was 38 Ω·cm. When observing the surface by the atomic force microscope, it was smoothed to the extent that the atomic step was seen. From the absorption spectra in the visible and ultraviolet regions, the absorption coefficient at 1.59 to 5.9 eV was 2,100 $cm^{-1}$, therefore, it was found to substantially transmit at the energy of not more than 5.9 eV.

Example 3

The aluminum nitride epitaxial layer which has the thickness of 130 μm was laminated on the silicon substrate using the reaction tube shown in FIG. 1 based on the method disclosed in "Embodiment 1" of JP-A 2005-252248, then it was immersed in a etchant prepared such that 50% of hydrofluoric acid, concentrated nitric acid, 98% of acetic acid and the pure water were 1:2:1:4 by volume ratio to dissolve only the silicon base which was the primary substrate, with result that the aluminum nitride selfsupporting substrate was obtained.

Subsequently, all the same procedures and conditions were used to grow the n-type conducting aluminum nitride semiconductor crystal except that the above aluminum nitride selfsupporting substrate was used instead of the sapphire (0001) substrate used in the Example 1.

The film thickness of the grown n-type conducting aluminum nitride semiconductor crystal was 5.2 μm and the growing rate was 10.4 μm/h. The silicon concentration measured by the secondary ion mass spectrometer was $7 \times 10^{19}$ cm$^{-3}$, the oxygen concentration was $1 \times 10^{19}$ cm$^{-3}$, and the chlorine concentration was not more than $1 \times 10^{18}$ cm$^{-3}$. The dislocation density was calculated according to the transmission electron microscope and it was $4.8 \times 10^9$ cm$^{-2}$. The resistivity measured by the noncontact resistivity measuring apparatus was 53 Ω·cm. When observing the surface by the atomic force microscope, it was smoothed to the extent that the atomic step was seen. From the absorption spectra in the visible and ultraviolet regions, the absorption coefficient at 1.59 to 5.9 eV was 1,800 cm$^{-1}$, therefore, it was found to substantially transmit at the energy of not more than 5.9 eV.

Example 4

The n-type conducting aluminum nitride semiconductor crystal layer was formed similarly to Example 3 except that the n-type conducting aluminum nitride semiconductor crystal was grown directly on the aluminum nitride selfsupporting substrate without forming the intermediate layer. When assessing the obtained n-type conducting aluminum nitride semiconductor crystal similarly to Example 3, following results were obtained: the film thickness of the n-type conducting aluminum nitride semiconductor crystal was 4.7 μm and the growing rate was 9.4 μm/h. For concentrations of impurities in the film, the silicon concentration was $1 \times 10^{20}$ cm$^{-3}$, the oxygen concentration was $1 \times 10^{19}$ cm$^{-3}$, and the chlorine concentration was not more than $1 \times 10^{18}$ cm$^{-3}$. Similarly, the dislocation density was $5.8 \times 10^9$ cm$^{-2}$. The resistivity was 86 Ω·cm. On the other hand, when observing the AFM for smoothness of the surface, the atomic step was not observed, 1.2 nm for the RMS, and the absorption coefficient at 1.59 to 5.9 eV was 2,050 cm$^{-1}$.

Comparative Example 1

In the Comparative Example, it was attempted to grow directly the n-type conducting aluminum nitride semiconductor crystal without forming the intermediate layer after thermal cleaning of the sapphire substrate. Conditions for the thermal cleaning and for growing the n-type conducting aluminum nitride semiconductor crystal were similar to those in Example 1. As a result, the film thickness of the n-type conducting aluminum nitride semiconductor crystal was 4.2 μm and the growing rate was 8.4 μm/h. For concentrations of impurities in the film, $5 \times 10^{19}$ cm$^{-3}$ for silicon and not more than $1 \times 10^{18}$ cm$^{-3}$ for chlorine, however, the oxygen concentration was $1 \times 10^{20}$ cm$^{-3}$ that was higher than that in the case of no insertion of the intermediate layer probably due to compensation for the carrier by oxygen, and resistivity was $10^7$ Ω·cm resulting in showing no conductivity. Appearance of the substrate was mirror surface, however, a number of pits were confirmed on the surface by an electron microscope.

The invention claimed is:

1. A method of manufacturing an n-type conductive aluminum nitride semiconductor crystal containing Si atom at a concentration of $1 \times 10^{18}$ to $5 \times 10^{20}$ cm$^{-3}$, wherein the semiconductor crystal has an absorption coefficient for light having an energy of not less than 1.59 ev and not more than 5.9 ev of not more than 5,000 cm$^{-1}$, and wherein an halogen atom content in the semiconductor crystal is not more than $5 \times 10^{18}$ cm$^{-3}$, the method comprising the steps of:
   (A) forming an aluminum nitride crystal layer having a thickness of not less than 0.5 nm on a single crystal substrate by vapor-phase growing, wherein a temperature of the substrate is 1,000 to 1,150° C., and wherein the heated single crystal substrate is contacted with a gas containing an Al halide and a nitrogen-containing compound to form an AlN crystal, and
   (B) preheating the obtained substrate having the aluminum nitride crystal layer on its surface to 1,200° C. or more, then forming an n-type conductive semiconductor crystal layer on the aluminum nitride crystal layer of the substrate by vapor-phase growing in which the preheated substrate is contacted with a gas containing an Al halide, a nitrogen-containing compound and a compound represented by the formula SiH$_x$Cl$_{4-x}$ wherein, x is an integer of 0 to 3, to form the n-type conductive aluminum nitride semiconductor crystal doped with Si atom.

2. A method of manufacturing a self-supporting substrate comprising an n-type conductive aluminum nitride semiconductor crystal containing Si atom at a concentration of $1 \times 10^{18}$ to $5 \times 10^{20}$ cm$^{-3}$, wherein the semiconductor crystal has an absorption coefficient for light having an energy of not less than 1.59 ev and not more than 5.9 ev of not more than 5,000 cm$^{-1}$, and wherein an halogen atom content in the semiconductor crystal is not more than $5 \times 10^{18}$ cm$^{-3}$, the method comprising the steps of:
   (A) forming an aluminum nitride crystal layer having a thickness of not less than 0.5 nm on a single crystal substrate by vapor-phase growing in which the heated single crystal substrate is contacted with a gas containing an Al halide and a nitrogen-containing compound to form an AlN crystal,
   (B') preheating the obtained substrate having the aluminum nitride crystal layer on its surface to 1,200° C. or more, then forming an n-type conductive aluminum nitride semiconductor crystal layer having a thickness of not less than 2 μm on the aluminum nitride crystal layer of the substrate by vapor-phase growing in which the preheated substrate is contacted with a gas containing an Al halide, a nitrogen-containing compound and a compound represented by the formula SiH$_x$Cl$_{4-x}$ wherein, x is an integer of 0 to 3, to form the n-type conductive semiconductor crystal doped with Si atom, and
   (C) separating the n-type conductive aluminum nitride semiconductor crystal layer doped with Si atom from the obtained substrate having the n-type conductive aluminum nitride semiconductor crystal layer doped with Si atom on the surface.

3. The method according to claim 2, wherein the temperature of the substrate in the above step (A) is set as 1,000 to 1,150° C.

4. A method of manufacturing a semiconductor device characterized by comprising the step of forming a semiconductor device structure on one surface of the self-supporting substrate produced by the method according to claim 2.

5. The method according to claim 4 comprising a step of forming an electrode layer on another surface of the self-supporting substrate.

* * * * *

UNITED STATES PATENT AND TRADEMARK OFFICE
CERTIFICATE OF CORRECTION

| | | |
|---|---|---|
| PATENT NO. | : 8,129,208 B2 | Page 1 of 1 |
| APPLICATION NO. | : 12/526196 | |
| DATED | : March 6, 2012 | |
| INVENTOR(S) | : Akinori Koukitu et al. | |

It is certified that error appears in the above-identified patent and that said Letters Patent is hereby corrected as shown below:

ON THE TITLE PAGE:

At item (22), change the PCT filing date from "Feb. 2, 2008" to --Feb. 5, 2008--.

Signed and Sealed this
Tenth Day of July, 2012

David J. Kappos
*Director of the United States Patent and Trademark Office*